(12) United States Patent
Nakamata

(10) Patent No.: US 7,029,767 B2
(45) Date of Patent: Apr. 18, 2006

(54) ORGANIC ELECTROLUMINESCENT DEVICE AND METHOD FOR MANUFACTURING SAME

(75) Inventor: Yuko Nakamata, Nagano (JP)

(73) Assignee: Fuji Electric Holdings Co., LTD, Tokyo (JP)

( * ) Notice: Subject to any disclaimer, the term of this patent is extended or adjusted under 35 U.S.C. 154(b) by 0 days.

(21) Appl. No.: 10/789,463

(22) Filed: Feb. 27, 2004

(65) Prior Publication Data

US 2004/0224183 A1 Nov. 11, 2004

(30) Foreign Application Priority Data

Mar. 6, 2003 (JP) ............................. 2003-060472
Jun. 4, 2003 (JP) ............................. 2003-159941

(51) Int. Cl.
H05B 33/02 (2006.01)
H05B 33/26 (2006.01)
B32B 19/00 (2006.01)

(52) U.S. Cl. ..................... 428/690; 428/917; 313/504; 313/506; 427/66

(58) Field of Classification Search ............... 428/690, 428/917; 427/66; 313/504, 506
See application file for complete search history.

(56) References Cited

U.S. PATENT DOCUMENTS 6,551,725 B1 * 4/2003 Raychaudhuri et al. ..... 428/690

FOREIGN PATENT DOCUMENTS

| EP | 1 179 862 A | 7/2001 |
|---|---|---|
| EP | 1 278 244 A | 7/2002 |
| JP | 10-162959 A | 6/1998 |
| JP | 2002-75658 A | 3/2002 |
| JP | 2002-260862 A | 9/2002 |
| JP | P3366401 B2 | 11/2002 |
| WO | WO 2004/049465 A | 11/2003 |

OTHER PUBLICATIONS

Tang, C.W. et al., "Organic electroluminescent diodes," Appl. Phys. Lett. 51, pp. 913-915 (Sep. 21, 1987).

* cited by examiner

Primary Examiner—Dawn Garrett
(74) Attorney, Agent, or Firm—Rossi, Kimms & McDowell, LLP

(57) ABSTRACT

An organic EL device is disclosed which has a buffer structure that mitigates sputtering damage inflicted in the process of forming a transparent top electrode, that exhibits sufficient electrical conductivity and light transmissivity, and that exhibits high electron injection efficiency. An organic EL device according to the invention includes, sequentially disposed on a substrate, a bottom electrode, an organic EL layer including at least an organic light emissive layer, a buffer structure, and a transparent top electrode through which light is emitted. The buffer structure is a multilayer structure having two or more first type buffer layers containing a transparent material and two or more second type buffer layers containing a metal or an alloy, with each of the second type buffer layers being disposed on one of the first type buffer layers. A method for manufacturing such an organic EL device also is disclosed.

30 Claims, 2 Drawing Sheets

ORGANIC ELECTROLUMINESCENT DEVICE AND METHOD FOR MANUFACTURING SAME

BACKGROUND OF THE INVENTION

The present invention relates to organic light emitting (EL) devices and a method for manufacturing the EL devices, and in particular, to a buffer structure in an organic EL device of a top emission system, and a method for fabricating the structure.

An organic electroluminescence device (hereinafter referred to as an organic EL device) comprising a laminated structure of organic thin films is known as an example of light emission devices applied to display apparatuses. Since C. W. Tang of Eastman Kodak Company disclosed a device with a double layer structure performing high efficient light emission in 1987 (*Appl. Phys. Lett.* vol. 51, p. 913 (1987)), numerous studies have been made to achieve practical application of organic EL devices.

In recent years there has been extensive development in the field of organic EL displays, particularly in the area of active-matrix drive systems for displays. The display in an active-matrix drive system is constructed with light sources of a plurality of organic EL devices formed on a substrate having switching elements of thin film transistors (TFTs). Since the variation in characteristics of the TFT or the organic EL device is great, the conventional display in the active-matrix drive system needs various driving circuits to compensate for the variations. However, complicated driving circuits increases the number of TFTs required to drive one pixel.

A majority of organic EL devices used for displays have a bottom emission type structure in which light is emitted through a glass substrate. FIG. 1(a) is a schematic cross sectional view of a bottom emission type organic EL device. When a bottom emission type organic EL devices is used in a display of the active-matrix drive system, an increase in the number of TFTs causes a decrease in light emission area in the bottom electrode. For this reason, a top emission type structure, in which light is emitted through a top electrode, is a more useful structure than the bottom emission type organic EL device (FIG. 1(a)) for the display on the active-matrix drive system. This type of device also is being developed. FIG. 1(b) is a schematic cross-sectional view of a top emission type organic EL device.

A top electrode of a top emission type organic EL device must be sufficiently transparent. Consequently, the top electrode is generally made of a transparent conductive film made of a substance that has a high transmission rate for visible light and a high electrical conductivity. The transparent conductive films include metallic thin films with a thickness of 5 nm or less of Au, Ag, Cu, Pt, and Pd, oxide semiconductor thin films of $SnO_2$, $TiO_2$, CdO, $In_2O_3$, and ZnO, and oxide semiconductor thin films of complex systems of these materials including ITO (indium-tin oxide) and IZO (indium-zinc oxide). Because the metallic thin films exhibit high light absorption and low stability due to small hardness, an oxide semiconductor thin film is primarily used for the transparent conductive film. Transparent conductive films made of ITO or IZO are used for electrodes in wide application areas of TVs, transparent heaters, and liquid crystal display devices.

Although the organic semiconductor thin film of ITO or IZO can be used for a top electrode in a top emission type organic EL device, there remain problems that have to be solved.

The first is to improve low efficiency in electron injection when a top electrode (cathode) of ITO or IZO is used. The electron injection efficiency of a top emission type organic EL device having a cathode of a transparent conductive film of IZO is lower than the electron injection efficiency of a bottom emission type organic EL device having a cathode of a metallic electrode of Al or Ag. This is caused by a difference in material properties as shown in Table 1. IZO exhibits a larger work function than Ag and Al, and a much lower carrier density. Therefore technology is desired to obtain a top emission type organic EL device that has a high electron injection efficiency. This allows enhanced carrier density of the cathode and achieves a work function that is lower than that of a bottom electrode (anode) and matches the numerical value of the work function of a cathode in a bottom emission type organic EL device.

TABLE 1

Properties of materials for a top electrode.

| material | work function (eV) | carrier density ($cm^{-3}$) |
|---|---|---|
| IZO | 4.80 | $10^{21}$ |
| Ag | 4.42 | $10^{23}$ |
| Al | 4.18 | $10^{23}$ |

A second problem of top emission type organic EL devices that must be addressed is damage to the organic EL layer during deposition of the top electrode. Sputtering is an efficient and simple method for depositing a thin film, and therefore is often applied to deposition of a transparent conductive film of IZO, for example. However, the energy in the deposition of a film is 300 to 400 eV for the sputtering method, which is much larger than the value of about 0.1 eV for an evaporation method and the value of 20 to 30 eV for an ion plating method. Consequently, when sputtering is used to form the top electrode the organic EL layer underlying the top electrode is liable to be damaged by collisions of high energy particles generated in the sputtering process. The high energy particles can include neutral atoms and negative ions from the target substance, neutral atoms and positive ions from the gas component, and electrons. An organic EL layer damaged in the deposition process often results in deterioration of device performance, including short-circuits, leakage, or lowered luminance efficiency. Accordingly, a technology is desired that reduces the damage on the organic EL layer, which is anticipated when a high energy deposition process such as sputtering is applied to form the top electrode.

The third problem of top emission type organic EL devices is the control of deterioration in the organic EL layer by oxygen. An electron injection layer is generally provided under the cathode to enhance electron injection efficiency of an organic EL device. However, if oxygen is present in the system for depositing the top electrode (cathode), the electron injection layer and the electron transport layer are apt to be oxidized, which may deteriorate performance of the organic EL layer. When a transparent conductive oxide is used as the electrode material, the adverse effect of oxygen cannot be ignored. If the organic EL layer is oxidized with oxygen in the system, the electron injection layer is oxidized, and this changes the original material properties, such that the device may not preserve design performance. When sputtering is used to deposit the top electrode, the organic EL layer also may be damaged by plasma of oxygen in the system originated from oxides or introduced gas. An oxygen plasma inflicts more severe damage on the organic EL layer than an inert gas plasma such as argon, and is apt to substantially lower luminance. Accordingly, a method is desired that controls degradation of the organic EL layer caused by the oxygen existing in the system at the time of deposition process.

In light of these problems, organic EL devices are being studied that have a buffer structure between the organic EL layer and the top electrode (cathode) in order to enhance the electron injection efficiency and to reduce the damage on the organic EL layer in the process for forming the top electrode.

For example, Japanese Unexamined Patent Application Publication No. H10-162959 discloses a top electrode (cathode) that comprises an electron injective metal and an amorphous transparent conductive layer in order to obtain a cathode exhibiting low electrical resistance and enough transparency. According to this document, an extremely thin metal film is provided on the organic EL layer. Such a metal film is, however, too thin to act as a buffer to mitigate the impact of sputtering, although it may improve the electron injection efficiency. Even if the thickness of the metal film is increased to improve resistance to impact of sputtering, desired luminance characteristics are very hard to obtain because the thickness of the metal film and the transmission rate are in a trade-off relationship.

Japanese Unexamined Patent Application Publication No. 2000-58265 discloses providing a buffer layer of phthalocyanine on an organic EL layer, i.e., on an electron transport layer, and diffusing an element such as Ce, Li, Ca, or Mg as a dopant, in order to reduce damage to the organic EL layer due to sputtering and to enhance electron injection efficiency. Although electron injection performance can be improved by means of the buffer layer disclosed in this document, phthalocyanine itself exhibits weak resistance to the impact of sputtering. Thus, the film thickness of from 5 to 100 nm of the buffer layer is insufficient to effectively mitigate impact on the organic EL layer by sputtering.

Japanese Unexamined Patent Application Publication No. 2002-75658 discloses providing a first buffer layer of alkali halide and second buffer layer of phthalocyanine on an organic EL layer, in order to reduce damage to the organic EL layer due to sputtering. Since the alkali halide used to form the first buffer layer is an insulator, film thickness of the first buffer layer is limited to less than 3 nm. On the other hand, the phthalocyanine used to form the second buffer layer is weak against impact of sputtering. This document thus discloses increasing the thickness of the second buffer layer of phthalocyanine to as thick as 200 nm. However, a thicker buffer layer lowers electrical conductivity and optical transmissivity.

Japanese Unexamined Patent Application Publication No. 2002-260862 discloses providing a first buffer layer of alkali halide and second buffer layer of a metal with low work function on an organic EL layer, in order to reduce damage to the organic EL layer due to sputtering. According to this document, the buffer layer with this structure enhances electron injection efficiency, reduces damage due to sputtering, and enhances optical transmissivity. Total thickness of the buffer layers is stated to be preferably less than 5 nm. The cathode (top electrode) disclosed in an embodiment in this document is a metal electrode such as silver or aluminum, which is not suited for application to a top emission type organic EL device. If the top electrode (cathode) is formed of a transparent conductive film of, for example, IZO by sputtering, damage on the organic EL layer is more severe than in the case of a top electrode of a metallic electrode. Consequently, the total thickness of the buffer layers of about 5 nm is insufficient to protect against the impact of sputtering, although improvement may be possible in electron injection efficiency and in optical transmission rate. Even if the thickness of the buffer layers is increased, desirable organic EL characteristics are difficult to obtain because the resistance to sputtering impact and optical transmissivity are in a trade-off relationship.

Various studies of buffer structure have been tried in order to improve electron injection efficiency or to reduce damage to the organic EL layer due to sputtering, as described above. However, the buffer structures studied so far have not allowed simultaneous improvement in electron injection efficiency and reduction of damage to the organic EL layer due to sputtering, while preserving sufficient optical transmissivity and electrical conductivity. Therefore, improvement is still demanded. Particularly in a top emission type organic EL device having a top electrode (cathode) of a transparent conductive film such as IZO, degradation of an organic EL layer due to oxygen cannot be ignored. Thus, a buffer structure is desired that protects the organic EL layer against the oxygen.

SUMMARY OF THE INVENTION

It is therefore an object of the present invention to provide an organic EL device comprising a buffer structure that permits to solve the problems accompanied by a top electrode (cathode) of a transparent conductive film such as IZO, namely the problems of degradation of electron injection performance, sputtering damage on the organic EL layer in the process of forming the top electrode, and degradation due to oxygen, while preserving sufficient transmissivity and conductivity.

Another object of the invention is to provide a method to manufacture such an organic EL device.

To solve the above-described problems, the inventors of the present invention extensively studied the buffer structure provided between the transparent top electrode and the organic EL layer, and found that an excellent result is achieved with a multi-layer buffer structure, to accomplish the present invention.

An organic EL device of the present invention comprises a substrate, a bottom electrode formed on the substrate, an organic EL layer including at least an organic light emissive layer formed on the bottom electrode, a buffer structure formed on the organic EL layer and consisting of two or more first type buffer layers containing a transparent material and two or more second type buffer layers containing a metal or an alloy, each of the second type buffer layers being laminated on one of the first type buffer layers, and a transparent top electrode through which light is emitted.

The thickness of the buffer structure is preferably less than or equal to about 20 nm. A ratio of a thickness of the first type buffer layer to a thickness of the second type buffer layer in the buffer structure is preferably in the range of 1:5 to 5:1. The second type buffer layer preferably has a work function less than 4.8 eV.

The transparent material in the first type buffer layer is preferably selected from the group consisting of LiF, $MgF_2$, and $Sb_2O_3$.

The metal in the second type buffer layer is preferably selected from the group consisting of alkali metals, alkaline earth metals, rare earth elements, transition elements, and 3B group elements of the Periodic Table, and the alloy in the second type buffer layer contains a metal selected from the group consisting of alkali metals, alkaline earth metals, rare earth elements, transition elements, and 3B group elements of the Periodic Table. The metal or the alloy preferably exhibits electronegativity in the range of 0.2 to 2.0. The metal preferably is selected from Al, Ag, Mg, and Mn, and the alloy contains one or more metals selected from Al, Ag, Mg, and Mn.

A method according to the present invention for manufacturing an organic EL device is directed to a manufacturing method of an organic EL device in which a bottom electrode, an organic EL layer, a buffer structure, and a transparent top electrode through which light is emitted, are sequentially formed on a substrate. The method comprises steps of forming a bottom electrode on a substrate, forming an organic EL layer including at least an organic light emissive layer on the bottom electrode, forming a buffer structure consisting of two or more first type buffer layers containing a transparent material and two or more second type buffer layers containing a metal or an alloy by alternately laminating the first type buffer layer and the second type buffer layer, and forming a transparent top electrode on the buffer structure by means of sputtering.

Thickness of the buffer structure is preferably less than or equal to about 20 nm. A ratio of a thickness of the first type buffer layer and a thickness of the second type buffer layer in the buffer structure is preferably in the range of 1:5 to 5:1. The second type buffer layer preferably has a work function less than 4.8 eV.

The transparent material in the first type buffer layer is preferably selected from the group consisting of LiF, $MgF_2$, and $Sb_2O_3$.

The metal in the second type buffer layer preferably is selected from the group consisting of alkali metals, alkaline earth metals, rare earth elements, transition elements, and 3B group elements of the Periodic Table, and the alloy in the second type buffer layer contains a metal selected from the group consisting of alkali metals, alkaline earth metals, rare earth elements, transition elements, and 3B group elements of the Periodic Table. The metal or the alloy preferably exhibits electronegativity in the range of 0.2 to 2.0. The metal preferably is selected from Al, Ag, Mg, and Mn, and the alloy contains one or more metals selected from Al, Ag, Mg, and Mn.

BRIEF DESCRIPTION OF THE DRAWINGS

FIG. 1(*b*) is a schematic cross-sectional view of a top emission type organic EL device.

DETAILED DESCRIPTION OF PREFERRED EMBODIMENTS

The present invention will be described in detail below. A first aspect of the present invention is directed to an organic EL device of a top emission type. An organic EL device of the invention comprises a substrate, a bottom electrode formed on the substrate, an organic EL layer including at least an organic light emissive layer formed on the bottom electrode, a buffer structure formed on the organic EL layer and consisting of two or more first type buffer layers (transparent material layers) containing a transparent material and two or more second type buffer layers (metallic layers) containing a metal or an alloy, each of the second type buffer layers being laminated on one of the first type buffer layers, and a transparent top electrode through which light is emitted.

Figure 1A:
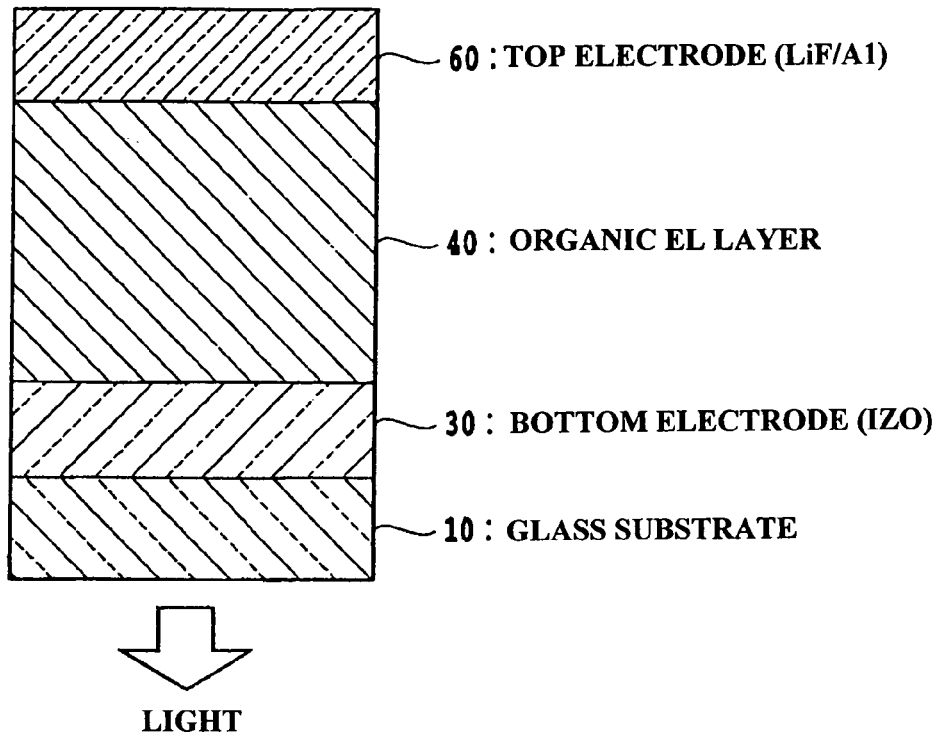
FIG. 1(*a*) is a schematic cross sectional view of a bottom emission type organic EL device.
Figure 1B:
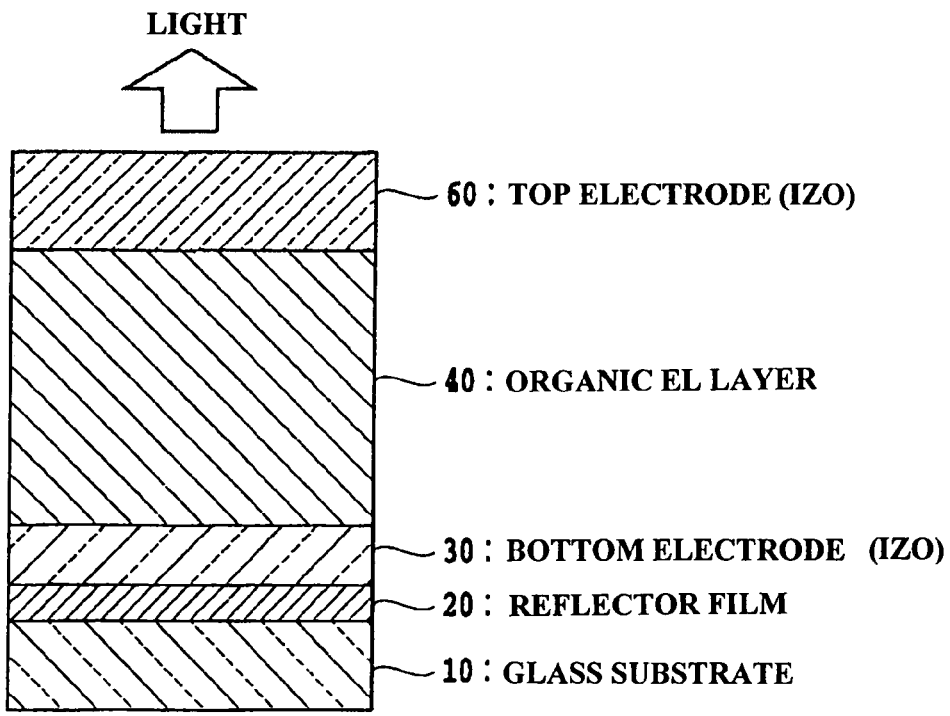
Figure 2:
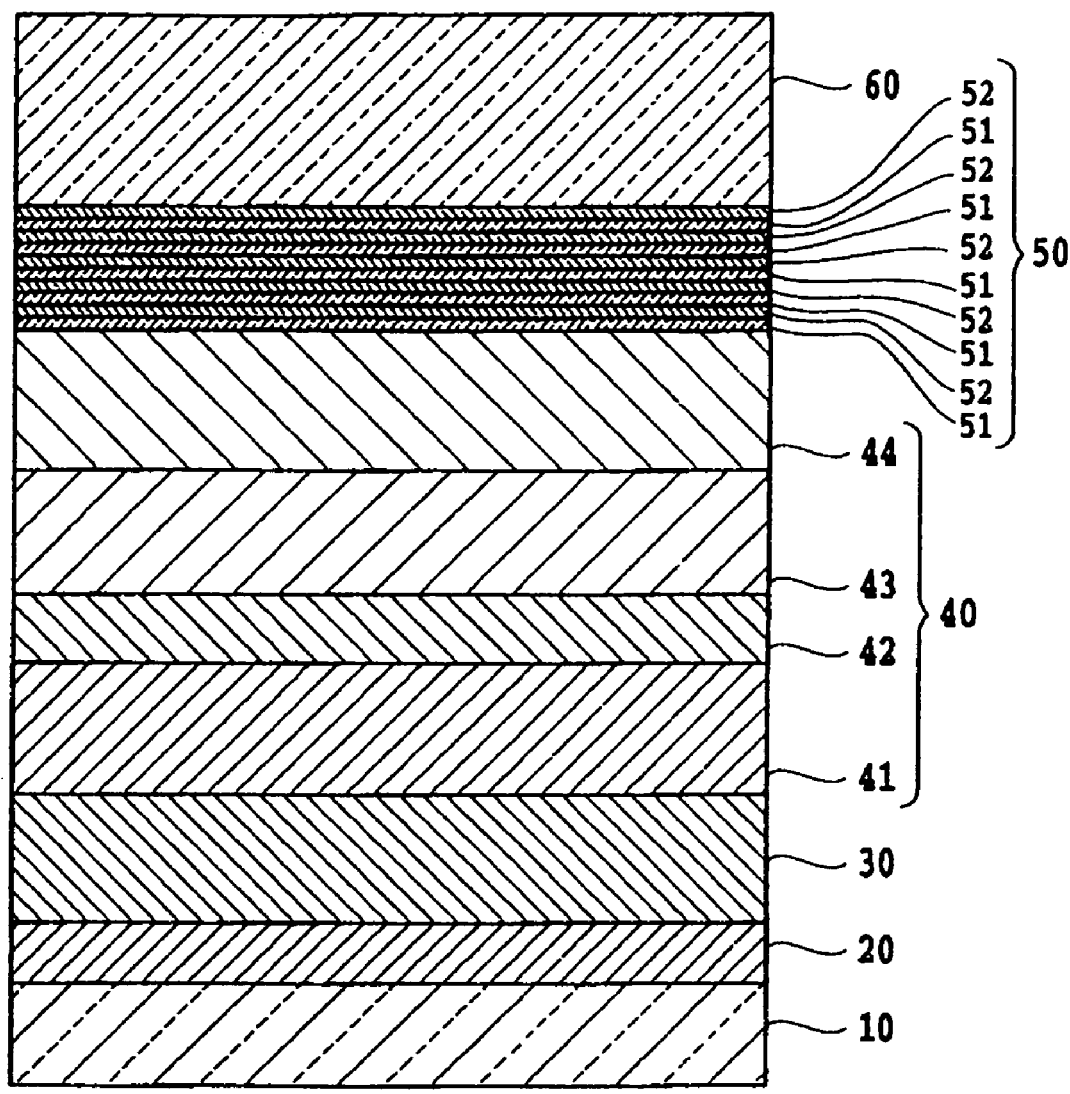
FIG. 2 is a schematic cross-sectional view of an example of embodiment of an organic EL device according to the invention.

FIG. 2 is a schematic cross-sectional view of an example of embodiment of an organic EL device according to the invention. As shown in FIG. 2, an organic EL device of the invention comprises a substrate 10, a reflective film 20, a bottom electrode (anode) 30, an organic EL layer 40, a buffer structure 50, and a transparent top electrode (cathode) 60. The buffer structure 50 has a multi-layer structure consisting of two or more first type buffer layers (transparent material layers) 51 and two or more second type buffer layers (metallic layers) 52. The organic EL layer 40 comprises a hole injection layer 41 adjacent to the anode 30, a hole transport layer 42, and organic light emissive layer 43, and an electron transport layer 44.

The present invention features, as shown above, a buffer structure having a multi-layer structure between a transparent top electrode and an organic EL layer, the buffer layer comprising alternately laminated first type buffer layers (transparent material layers) and second type buffer layers (metallic layers). The multi-layer structure of the buffer structure solves problems of degraded light transmissivity and electrical conductivity that are accompanied by increased thickness of the buffer structure. When the buffer structure is a multi-layer structure, thickness of each layer can be reduced to be very thin. As a result, each of the first type buffer layers (transparent material layer) and the second type buffer layers (metallic layers) constructing the buffer structure is allowed to be not a perfect continuous sheet, but to be a discontinuous film consisting of a plurality of island-shape areas. The "discontinuous film" refers to island-shaped areas that are separated from each other or that partially contact each other; the discontinuous film does not completely cover the deposition surface of the buffer structure.

When the thin film is formed of island-shaped areas, the island-shaped areas of a metal or an alloy have contacting parts between the layers (in the direction perpendicular to the film surface). When at least the transparent material layers of the buffer structure are made discontinuous, the transparent material layers do not completely separate the metallic layers microscopically. Consequently, electrical conductivity through the buffer structure can be preserved even when an insulative transparent material is used. Therefore, the present invention permits an increase in thickness of the buffer structure without degradation of transmissivity and conductivity. A buffer structure of the invention, as compared with a conventional buffer structure, can preserve sufficient conductivity while reducing attenuation of light emitted from the organic EL layer.

As can be seen from the above description, each layer constructing the buffer structure must be sufficiently thin to attain satisfactory transmissivity and conductivity of the buffer structure. If the first type buffer layer of transparent material is thick, the conductivity degrades since the transparent material is an insulator. If the second type buffer layer of a metal or an alloy is thick, the metallic layer is disposed continuously resulting in degradation of transmissivity.

Accordingly, the thickness of a layer of the first and second type buffer layers is preferably in a range that allows each of the metallic and the transparent material to preserve a fine island shape. Namely, the thickness per layer is preferably in the range of 1 to 5 nm, more preferably in the range of 1 to 2 nm. If the thickness per layer is larger than 5 nm, each of the metallic or transparent material forms a continuous film, which degrades light transmissivity and electric conductivity. The average thickness of a thin film with island-shaped areas is not equal to average height of the island-shaped area. A thickness of a layer in the specification is defined as an average of the film thickness over the whole surface of the substrate. A ratio of a thickness of the first type buffer layer to a thickness of the second type buffer layer is preferably in the range of 1:5 to 5:1, more preferably about 1:1. The thickness of the buffer structure must be sufficiently thick to withstand sputtering impact, while permitting enough transmission of light from the organic EL layer. A total thickness of the buffer structure is preferably less than or equal to 20 nm, more preferably less than or equal to 10 nm. The buffer structure preferably exhibits transmission rate for visible light wave-length range of 380 nm to 780 nm of more than 40%, more preferably more than 60%, most preferably more than 80%.

The transparent material composing the first type buffer layers of the buffer structure is preferably so transparent that the light from the organic EL layer is sufficiently transmitted. The transparent material is preferably selected from materials that permit the use of a deposition method with little damage inflicted on the organic EL layer in the deposition process. Such deposition methods include a method of evaporation by heating and electron beam deposition. It is further desirable that the transparent material exhibit good electron injection performance and high electrical conductivity. In this regard, the transparent materials that are favored in the present invention include fluorides or oxides of alkali metals or alkaline earth metals. Specifically, the transparent material is preferably selected from LiF, $MgF_2$, CaF, NaF, $SiO_2$, and $Sb_2O_3$. More preferably, the transparent material is selected from LiF, $MgF_2$, and $Sb_2O_3$, which can be properly deposited by heating evaporation.

The second type buffer layer directly suffers the sputtering damage in the process of forming a transparent top electrode, and also is directly affected by oxygen originated from transparent conductive oxide of the top electrode material. Accordingly, the second type buffer layer of metallic substance is preferably composed of a metal or an alloy that exhibits proper resistance to sputtering and effectively protects the organic EL layer against oxygen. Considering enhancement of the carrier density and matching with the work function of the cathode (LiF/Al) in a bottom emission type organic EL device, the second type buffer layer of metallic substance preferably exhibits work function less than 4.8 eV, more preferably in the range of 2.0 to 4.5 eV, most preferably in the range of 2.0 to 4.0 eV.

The second type buffer layer can be composed of a metal selected from a group consisting of alkali metals, alkaline earth metals, rare earth metals, transition metals, and 3B group elements of the Periodic Table, or an alloy containing metals selected from this group. A metal or an alloy composing the second type buffer layers can be selected from materials that have a tendency to incorporate oxygen or a tendency to be oxidized. That kind of material can effectively protect an organic EL layer against oxygen. Accordingly, a metal or an alloy favorably used in the invention preferably exhibits electronegativity in a range of 0.2 to 2.0, more preferably 0.2 to 1.6, and most preferably 0.2 to 1.0. Preferred materials include alkaline earth metals such as Be, Mg, Ca, Sr, and Ba that are known as contact getters and alloys containing these metals; rare earth elements such as Dy, Er, and Yb and alloys containing these elements; and oxygen adsorptive transition elements such as Ti, V, and Zr that are known as dispersion getters and alloys containing these elements.

From the viewpoint of the work function, favorable materials for the second type buffer layer include Al, Ag, Mg, and Mn. Alloys containing these metals are also favorable, for example, AlLi, MgAg, AgLi, AlZn, MgAgZn, AlBa, and AlDy.

Forming a metallic layer composed of the materials as described above can be appropriately executed by a deposition method affecting little on the organic EL layer, for example evaporation by resistance heating or an electron beam method.

The buffer structure itself can serve as a good electron injection layer when the materials of the first type buffer layers and the second type buffer layers are appropriately combined. An example of such combination can be a first type buffer layer of LiF and a second type buffer layer of aluminum.

As described above, a buffer structure having multilayer structure permits a totally thick buffer structure as well as securing conductivity and transmissivity of the buffer structure. Therefore, an organic EL device can be provided that suffers very little damage or degradation in the organic EL layer, even when the top electrode is formed by a sputtering method that includes oxygen in the system.

The following describes construction elements other than the buffer structure in detail.

A substrate can be a transparent substrate of glass or plastics, or a metal or an alloy to reflect light.

A bottom electrode is provided on the substrate. The material for the bottom electrode can be a metal selected from Cr, Ag, Cu, and Au, an alloy containing one or more of these metals such as CrB or NiP, or a transparent conductive material such as ITO or IZO, although not limited to these materials. When a transparent conductive material is used for the bottom electrode material, any reflection means is appropriately provided. The reflection means only needs to effectively reflect light from the organic EL layer to the direction of the transparent top electrode. An example of the reflection means can be a reflector film of a metal or an alloy that is provided on the front surface or on the back surface of a transparent substrate of glass or plastics and reflects light. The reflector film can be patterned on the transparent substrate corresponding to the shapes of the bottom electrode. The reflector film disposed on the transparent substrate also serves as an underlayer for an organic EL layer, so the reflector film is preferably composed of an amorphous film, which exhibits excellent flatness. A metallic substance suited for the amorphous film includes CrB, CrP, and NiP. The substrate can be made of a light reflecting metal or alloy with an insulation layer, in place of a transparent substrate. The substrate itself, in that case, acts as a reflector film.

When an organic EL device having a plurality of light emissive parts is formed for use in a display apparatus, the shape of the bottom electrode and drive circuits provided on the substrate can employ either of an active matrix system or a passive matrix system without special limitation.

An organic EL layer is provided on the bottom electrode. The organic EL layer includes at least an organic light emissive layer that emits light by recombination of an electron and a hole generated by applying voltage between an anode and a cathode. The organic EL layer can also include, as necessary, a hole injection layer, a hole transport layer, an electron transport layer and/or electron injection layer. Specifically, the following structure can be taken:
 (1) organic light emissive layer,
 (2) hole injection layer/organic light emissive layer,
 (3) organic light emissive layer/electron transport layer, (4) hole injection layer/organic light emissive layer/electron transport layer,
(5) hole injection layer/hole transport layer/organic light emissive layer/electron transport layer, and
(6) hole injection layer/hole transport layer/organic light emissive layer/electron transport layer/electron injection layer.

In an organic EL layer having a structure of the above (1) through (6), a bottom electrode (anode) is connected to the organic light emissive layer or the hole injection layer. The transparent top electrode (cathode) is connected through a buffer structure to the organic light emissive layer, the electron transport layer, or the electron injection layer. In an organic EL device of the invention, suitably selected material allows the buffer structure to function as an appropriate electron injection layer.

Each layer of the organic EL layer can be composed of known materials without special restriction. The hole injection layer can be composed of copper phthalocyanine (Cu-Pc), for example. The hole transport layer can be made of 4,4'-bis[N-(1-naphthyl)-N-phenylamino] biphenyl (α-NPD), for example. Material for the organic light emissive layer can be selected corresponding to desired color tone. Material to obtain blue to blue-green color, for example, can be selected from fluorescent whitening agents such as benzothiazole, benzoimidazole, and benzoxazole, metal chelated oxonium compounds, styryl benzene compounds, and aromatic dimethylidyne compounds. The electron transport layer can be made of aluminum chelate ($Alq_3$) or benzazule, for example. Material for the electron injection layer can be selected from alkali metals such as Li, Na, K, and Cs, alkaline earth metals such as Ba and Sr, rare earth elements, and fluorides of these elements. Transmission rate of the electron injection layer is preferably more than 40%, and more preferably more than 80%. The material for the electron injection layer can be appropriately selected from the substances that exhibit such transmission rate. Deposition of each layer is generally carried out applying a vacuum evaporation method, although a coating method also can be used.

The top electrode is provided over a buffer structure on the organic EL layer. The present invention is directed to a top emission type organic EL device in which light is emitted through the top electrode. Accordingly, the top electrode preferably exhibits transmission rate more than 80% in the wave length range of visible light that is from 380 nm to 780 nm. The top electrode is preferably formed of a film of transparent conductive oxide such as IZO or ITO.

An organic EL device of the invention having a structure as described above preferably is sealed off as required using a sealing member of glass or transparent resin for enhancing air-tightness. A commonly used sealing method can be applied to an organic EL device of the invention. For example, an organic EL device can be sealed off with a sealing substrate (transparent substrate), a peripheral sealing layer, and a filler layer. The peripheral sealing layer joins the sealing substrate with the support substrate on which a bottom electrode, an organic EL layer, and a top electrode are laminated, and serves to protect the internal components against oxygen and moisture in the outer environment. The peripheral sealing layer can be formed of a UV-setting (hardenable by ultraviolet radiation) resin. Formation of the peripheral sealing layer can be accomplished by irradiating ultraviolet light to harden the UV-setting resin after aligning the support substrate with the sealing substrate. In case a filler material is included in the internal space, a hole is bored at a location of the peripheral sealing layer and the peripheral sealing layer is hardened. Then, the filler is injected through the hole, and finally, the hole is plugged up. The sealing substrate is not specially restricted as long as it seals the organic EL device and does not transmit external moisture or harmful gases. A thickness of the sealing substrate can be determined to any value within a range commonly used in the art. The filler layer fills the peripheral sealing layer, the sealing substrate, the organic EL device, and the internal space as required and enhances closeness of the organic EL device. Filler material for forming the filler layer can be an inactive liquid or inactive gel that does not adversely affect performance of the organic EL device. The filler material also may be liquid that changes to a gel state after injection to the internal space. Examples of such material include silicone resin, fluorine-containing inactive liquid, or fluorine oil. Preliminary application of a getter material such as calcium oxide onto the sealing members of the sealing substrate, the peripheral sealing layer, and the filler layer makes protection of the organic EL device against oxygen more effective.

A display apparatus for information equipment can be constructed using an organic EL device of a first aspect of embodiment according to the present invention as described herein. An organic EL device of the invention, which is of top emission type, is particularly effective to construct a display apparatus that requires a wide area display.

A further aspect of the present invention relates to a method for manufacturing a top emission type organic EL device. The manufacturing method of the invention is directed to a method for manufacturing an organic EL device including a bottom electrode, an organic EL layer that contains at least an organic light emissive layer, a buffer structure, and a transparent top electrode through which light is emitted, sequentially formed on a substrate. The method comprises steps of:

(a) forming a bottom electrode on a substrate,
(b) forming an organic EL layer including at least an organic light emissive layer on the bottom electrode,
(c) forming a buffer structure consisting of two or more first type buffer layers containing a transparent material and two or more second type buffer layers containing a metal or an alloy by alternately laminating the first type buffer layer and the second type buffer layer, and
(d) forming a transparent top electrode on the buffer structure by means of a sputtering method.

Material properties and specific examples of the metal and the alloy, and the transparent material in the above-described method are the same as described in the first aspect of the invention.

Since a multilayer buffer structure is formed by alternately laminating a first type buffer layer containing a transparent material and a second type buffer layer containing a metal or an alloy according to the manufacturing method of the invention, each buffer layer of the buffer structure can be made thin. By making each layer thin, sufficient conductivity and transmissivity can be achieved. Therefore, the buffer structure can be made thick enough so that the sputtering impact can be mitigated while preserving proper conductivity and transmissivity. The buffer structure is preferably formed not by a sputtering method that causes severe damage on the organic EL layer in the process of depositing buffer structure, but by a method of evaporation by heating or an electron beam method that have less effect on the organic EL layer.

A transparent top electrode is formed after deposition of the buffer structure. The buffer structure serves as a protective layer for the organic EL layer in the process of forming the top electrode, to effectively mitigate damage on the organic EL layer due to sputtering. When the transparent top electrode is formed with a sputtering method that uses a target of an oxide, an oxygen plasma typically is generated in addition to the argon plasma. Even when oxygen gas is introduced in the system, damages and degradation of the organic EL layer due to sputtering damage are reduced by composing the second type buffer layers with a metal or an alloy that is easily oxidized. Since the second type buffer layer absorbs the sputtering impact and absorbs oxygen existing in the system by oxidation of the second type buffer layer itself, reaction of the organic EL layer with oxygen is suppressed, thereby controlling deterioration of the organic EL layer. Thus, damage and degradation on the organic EL layer in the process of forming the top electrode are reduced by the buffer layer according to the present invention. Therefore, an organic EL device with high quality can be effectively provided even when a sputtering method is employed, which would otherwise inflict severe damage on the organic EL layer.

The present invention will be specifically described referring to examples of some preferred embodiments. The examples, however, shall not restrict the present invention. Needless to say, variation and modification can be made by a person skilled in the art within the spirit and scope of the invention.

EXAMPLE 1

To evaluate the performance of buffer structures, samples having a multilayer buffer structure on an organic EL layer (electron transport layer) were fabricated. The buffer structure was composed of alternately laminated LiF layers (transparent material layers) and aluminum layers (metallic layers). The samples were fabricated using a three chamber type evaporation apparatus (including a load lock chamber, an organic chamber, and a metal chamber) through the procedure described below. The vacuum chamber was evacuated to $1 \times 10^{-5}$ Pa. The evaporation source used was a resistance heating type. The material of the crucible was quartz, Mo, or BN corresponding to evaporation materials.

A glass substrate was moved into the organic chamber. An organic EL layer of $Alq_3$ 162 nm thick was deposited at a deposition rate of 2 Å/s on the glass substrate. The glass substrate having $Alq_3$ layer thereon was moved to a metal chamber, and a LiF layer 1 nm thick was formed on the $Alq_3$ layer at a deposition rate of 0.25 Å/s. An aluminum layer 1 nm thick was formed on the LiF layer at a deposition rate of 2.5 Å/s. A process to alternately deposit a LiF layer 1 nm thick and an aluminum layer 1 nm thick was repeated five times under the same conditions as in the previous process. Thus, a multilayered buffer structure consisting of alternately laminated LiF layers 1 nm thick and aluminum layers 1 nm thick was formed. The buffer structure included 10 layers and had a total thickness of 10 nm.

The transparency of the thus obtained sample of LiF/Al multilayer structure was evaluated. The result is shown in Table 2. The transparency was evaluated by measuring transmission rate at a wavelength of 500 nm using a spectrophotometer.

COMPARATIVE EXAMPLE 1

A comparative sample was fabricated using the same evaporation apparatus as for Example 1 through the procedure shown below. An organic EL layer of $Alq_3$ that was 162 nm thick was deposited at a deposition rate of 2 Å/s. Then, a LiF layer 5 nm thick was formed at a deposition rate of 0.25 Å/s. By depositing an aluminum layer 5 nm thick at a deposition rate of 2.5 Å/s, a buffer structure having a LiF/Al single layer structure was formed. The buffer structure consisted of two layers and had a total thickness of 10 nm.

Transparency of the thus obtained comparative sample was measured in the same manner as for Example 1. The result is shown in Table 2.

COMPARATIVE EXAMPLE 2

A comparative sample was fabricated using the same evaporation apparatus as for Example 1 through the procedure shown below. An organic EL layer of $Alq_3$ that was 162 nm thick was formed on a glass substrate at a deposition rate of 2 Å/s. Then, a LiF layer 1 nm thick was formed at a deposition rate of 0.25 Å/s. By depositing an aluminum layer 5 nm thick at a deposition rate of 2.5 Å/s a buffer structure having a LiF/Al single layer structure was formed. Transparency of the thus obtained comparative sample was measured in the same manner as for Example 1. The result is shown in Table 2.

TABLE 2

Transmission rate of the samples.

| | construction | number of layers | transmission rate (500 nm) |
|---|---|---|---|
| Example 1 | (LiF 1.0 nm/Al 1.0 nm) × 5 | 10 | 65% |
| Comp Ex 1 | LiF 5.0 nm/Al 5.0 nm | 2 | 45% |
| Comp Ex 2 | LiF 1.0 nm/Al 5.0 nm | 2 | 40% |

As apparent from the Table 2, a multilayered buffer structure as in Example 1 exhibits a higher transmission rate than a single layer buffer structure (Comparative Example 1 or 2). It has been shown that a decrease in transmission rate of a thick buffer structure can be suppressed by making the buffer structure multilayered.

Comparing the buffer structures having the equal total aluminum thickness (Comparison between Example 1 and Comparative Example 2), a multilayered buffer structure consisting of alternately laminated metallic layers and transparent material layers according to the invention exhibits higher transmission rate than a buffer structure having a single metallic layer.

EXAMPLE 2

An organic EL device having a buffer structure of a multilayer structure was manufactured as follows.

A CrB film 100 nm thick was deposited on a glass substrate. After patterning, the processes of drying (at 150° C.) and UV treatment (at room temperature and at 150° C.) were corducted to form a reflective electrode of CrB. Deposition of the CrB film was carried out by a DC sputtering method under room temperature using sputtering gas of argon supplying sputtering power of 300 W.

The glass substrate with the reflective electrode of CrB formed thereon in the previous steps was moved to an evaporation apparatus. The vacuum chamber was evacuated to $1 \times 10^{-5}$ Pa. Holding the vacuum, an organic EL layer, a buffer structure, and a cathode were sequentially formed. The organic EL layer was comprised of a hole injection layer, a hole transport layer, an organic light emmisive layer, and an electron transport layer. The hole injection layer was formed by depositing copper phthalocyanine (CuPc) to a thickness of 20 nm. The hole transport layer was formed by depositing 4,4'-bis[N-(1-naphthyl)-N-phenylamino] biphenyl (α-NPD) to a thickness of 20 nm. The organic light emmisive layer was formed by depositing 4,4'-bis(2,2'-diphenylvinyl) biphenyl (DPVBi) to a thickness of 40 nm. The electron transport layer was formed by depositing aluminum chelate ($Alq_3$) to a thickness of 20 nm.

Then, a buffer structure of a multilayer structure was formed using a metal mask. A process to alternately deposit a LiF layer 1 nm thick and an aluminum layer 1 nm thick was repeated five times to form a multilayered buffer structure consisting of alternately laminated LiF layers 1 nm thick and aluminum layers 1 nm thick. The buffer structure included 10 layers and had a total thickness of 10 nm.

A cathode of IZO was formed on the multilayered buffer structure formed in the previous step. Formation of the cathode was carried out using an IZO target of $In_2O_3$-10% ZnO and argon as the sputtering gas under a pressure of 0.3 Pa at a sputtering power of 100 W. The film thickness was 75 nm.

Current density and luminance were measured by applying pulse voltage (pulse IVL) to the thus obtained organic EL device.

COMPARATIVE EXAMPLE 3

This comparative example relates to an organic EL device having a single layer buffer structure. An organic EL device was manufactured in the same manner as in Example 2 except that the buffer structure consisted of a LiF layer 5 nm thick and an aluminum layer 5 nm thick. The buffer structure had two layers: one LiF layer and one aluminum layer. The total thickness of the buffer structure was 10 nm.

Current density and luminance were measured by applying pulse voltage to the thus obtained organic EL device. The results are given in Table 3. Although the buffer structure of this comparative example has a total thickness equal to the total thickness of the buffer structure of Example 2, a thickness per one layer of LiF is larger in the comparative example. As a result, conductivity decreased and the voltage value has been shown to increase significantly.

COMPARATIVE EXAMPLE 4

This comparative example relates to an organic EL device having a buffer structure of a single layer structure. An organic EL device was manufactured in the same manner as in Example 2 except that the buffer layer consisted of a LiF layer 1 nm thick and an aluminum layer 5 nm thick. The buffer structure had two layers: one LiF layer and one aluminum layer. The total thickness of the buffer structure was 6 nm.

Current density and luminance were measured by applying pulse voltage to the thus obtained organic EL device. The results are given in Table 3. Although the buffer structure of this comparative example had a total thickness less than the total thickness of the buffer structure of Example 2, the thickness of the aluminum layer was a large value of 5 nm. As a result, transmission rate decreased and, accordingly, the luminance has been shown to decrease.

EXAMPLE 3

An organic EL device having a multilayered buffer structure was manufactured in the same manner as in Example 2 except that the buffer structure consisting of 10 layers and having total thickness of 10 nm was formed by repeating five times the process of alternately laminating a LiF layer 0.5 nm thick and an aluminum layer 1.5 nm thick. Current density and luminance were measured by applying pulse voltage to the thus obtained organic EL device. The results are given in Table 3.

COMPARATIVE EXAMPLE 5

An organic EL device having a buffer structure 2.0 nm thick consisting of a LiF layer 0.5 nm thick and an aluminum layer 1.5 nm thick was manufactured in the same manner as in Example 2. Current density and luminance were measured by applying pulse voltage to the thus obtained organic EL device. The results are given in Table 3.

COMPARATIVE EXAMPLE 6

An organic EL device having a buffer structure 2.0 nm thick consisting of a LiF layer 0.5 nm thick and a yttrium (Y) layer 1.5 nm thick was manufactured in the same manner as in Example 2. Current density and luminance were measured by applying pulse voltage to the thus obtained organic EL device. The results are given in Table 3. A buffer structure composed of an extremely thin LiF layer and an extremely thin yttrium layer is known to improve sputtering damage inflicted in the process of forming a metallic top electrode of Al or Ag. However, it has been revealed that the mitigation effect decreases for sputtering using an oxide target such as IZO as a material for forming a transparent top electrode.

COMPARATIVE EXAMPLE 7

An organic EL device having a buffer structure 2.0 nm thick consisting of LiF layer 0.5 nm thick and a manganese (Mn) layer 1.5 nm thick was manufactured in the same manner as in Example 2. Current density and luminance were measured by applying pulse voltage to the thus obtained organic EL device. The results are given in Table 3. A buffer structure composed of a LiF layer and a manganese layer is known to improve sputtering damage inflicted in the process of forming a metallic top electrode of aluminum or silver. However, it has been revealed that the mitigation effect decreases for sputtering using an oxide target such as IZO as a material for forming a transparent top electrode.

TABLE 3

Performance evaluation of organic EL device.

| | buffer structure | cathode material | current density (A/cm) | luminance (cd/m$^2$) | voltage (V) |
|---|---|---|---|---|---|
| Example 2 | (LiF 1.0 nm/Al 1.0 nm) × 5 | IZO | $1 \times 10^{-2}$ | 618 | 6.23 |
| Comp Ex 3 | LiF 5.0 nm/Al 5.0 nm | IZO | $1 \times 10^{-2}$ | 464 | 10.60 |
| Comp Ex 4 | LiF 1.0 nm/Al 5.0 nm | IZO | $1 \times 10^{-2}$ | 445 | 6.05 |

TABLE 3-continued

Performance evaluation of organic EL device.

| | buffer structure | cathode material | current density (A/cm) | luminance (cd/m$^2$) | voltage (V) |
|---|---|---|---|---|---|
| Example 3 | (LiF 0.5 nm/Al 1.5 nm) × 5 | IZO | $1 \times 10^{-2}$ | 550 | 6.21 |
| Comp Ex 5 | LiF 0.5 nm/Al 1.5 mm | IZO | $1 \times 10^{-2}$ | 402 | 6.16 |
| Comp Ex 6 | LiF 0.5 nm/Y 1.5 nm | IZO | $1 \times 10^{-2}$ | 383 | 6.08 |
| Comp Ex 7 | LiF 0.5 nm/Mn 1.5 nm | IZO | $1 \times 10^{-2}$ | 408 | 6.12 |

As shown in Table 3, the organic EL devices having a multilayered buffer structure according to the present invention (Examples 2 and 3) exhibit superior performance to the organic EL devices having a buffer structure that is not a multilayer structure (Comparative Examples 3, 4, 5, 6, and 7). The buffer layer according to the invention has increased its thickness while preserving sufficient transmissivity and conductivity. Moreover, the buffer layer of the invention has effectively mitigated damage that would be inflicted on the organic EL layer by sputtering using an oxide target. Therefore, the superior performance has been brought about to the organic EL devices of the invention.

EXAMPLE 4

A CrB film 100 nm thick was deposited on a glass substrate. After patterning, the processes of drying (at 150° C.) and UV treatment (at room temperature and at 150° C.) were conducted to form a reflective electrode of CrB. Deposition of the CrB film was carried out by a DC sputtering method under room temperature using sputtering gas of argon supplying sputtering power of 300 W.

The glass substrate with a reflective electrode formed thereon in a previous step was moved to a seven chamber type evaporation apparatus. The vacuum chamber was evacuated to $1 \times 10^{-5}$ Pa. Holding the vacuum, an organic EL layer, a buffer structure, and a cathode were sequentially formed on the substrate with the reflective electrode.

The organic EL layer was comprised of a hole injection layer, a hole transport layer, an organic light emissive layer, an electron transport layer, and an electron injection layer. The evaporation source used for depositing these layers was of a resistance heating type. Material of the crucible was quartz, Mo, BN, or PBN corresponding to the material of each layer. The evaporation rate was 2 to 4 Å/s. The hole injection layer was formed by depositing copper phthalocyanine (CuPc) to a thickness of 20 nm. The hole transport layer was formed by depositing t-butyl peroxybenzoate (TBPB) to a thickness of 20 nm. The organic light emissive layer was formed by depositing 4,4'-bis(2,2'-diphenylvinyl) biphenyl (DPVBi) to a thickness of 40 nm. The electron transport layer was formed by depositing aluminum chelate (Alq) to a thickness of 20 nm.

The buffer layer had a multilayered structure consisting of alternately laminated LiF layers and MgAg layers. The buffer structure was formed using a metal mask. A process to alternately deposit a LiF layer 1 nm thick and a MgAg layer 1 nm thick was repeated five times to form a multilayered buffer structure consisting of alternately laminated LiF layers 1 nm thick and MgAg layers 1 nm thick. The buffer structure included 10 layers and had a total thickness of 10 nm.

A cathode of IZO was formed on the multilayered buffer structure by means of sputtering method holding the vacuum. Formation of the cathode was carried out using an IZO target of In$_2$O$_3$-10% ZnO and argon as the sputtering gas under a pressure of 0.3 Pa with a sputtering power of 100 W. The film thickness was 75 nm.

Finally, the thus obtained organic EL device was moved to a glow box (in which both oxygen concentration and moisture concentration were less than several ppm) without exposure to the atmosphere. A sealing member was adhered to the organic EL device with an ultraviolet-hardenable adhesive. A getter material of CaO was applied to the internal part of the sealing member beforehand.

Current density and luminance were measured by applying pulse voltage (pulse IVL) to the thus obtained organic EL device. The results are shown in Table 4.

COMPARATIVE EXAMPLE 8

An organic EL device having a buffer structure 10.0 nm thick consisting of a LiF layer 5.0 nm thick and an MgAg layer 5.0 nm thick was manufactured in the same manner as in Example 4. Current density and luminance were measured by applying pulse voltage to the thus obtained organic EL device. The results are given in Table 4.

EXAMPLE 5

An organic EL device having a multilayered buffer structure was manufactured in the same manner as in Example 4 except that a buffer structure consisting of 10 layers and having total thickness of 10 nm was formed by repeating five times the process of alternately laminating a LiF layer 1.0 nm thick and an AlLi layer 1.0 nm thick. Current density and luminance were measured by applying pulse voltage to the thus obtained organic EL device. The results are given in Table 4.

COMPARATIVE EXAMPLE 9

An organic EL device having a buffer structure 10.0 nm thick consisting of a LiF layer 5.0 nm thick and an AlLi layer 5.0 nm thick was manufactured in the same manner as in Example 4. Current density and luminance were measured by applying pulse voltage to the thus obtained organic EL device. The results are given in Table 4.

EXAMPLE 6

An organic EL device having a multilayered buffer structure was manufactured in the same manner as in Example 4 except that a buffer structure consisting of 10 layers and having total thickness of 10 nm was formed by repeating five times the process of alternately laminating a LiF layer 1.0 nm thick and an AlDy layer 1.0 nm thick. Current density and luminance were measured by applying pulse voltage to the thus obtained organic EL device. The results are given in Table 4.

COMPARATIVE EXAMPLE 10

An organic EL device having a buffer structure 10.0 nm thick consisting of a LiF layer 5.0 nm thick and an AlDy layer 5.0 nm thick was manufactured in the same manner as in Example 4. Current density and luminance were measured by applying pulse voltage to the thus obtained organic EL device. The results are given in Table 4.

EXAMPLE 7

An organic EL device having a multilayered buffer structure was manufactured in the same manner as in Example 4 except that a buffer structure consisting of 10 layers and having a total thickness of 10 nm was formed by repeating five times the process of alternately laminating a LiF layer 1.0 nm thick and an MgAgZn layer 1.0 nm thick. Current density and luminance were measured by applying pulse voltage to the thus obtained organic EL device. The results are given in Table 4.

COMPARATIVE EXAMPLE 11

An organic EL device having a buffer structure 10.0 nm thick consisting of a LiF layer 5.0 nm thick and an MgAgZn layer 5.0 nm thick was manufactured in the same manner as in Example 4. Current density and luminance were measured by applying pulse voltage to the thus obtained organic EL device. The results are given in Table 4.

organic EL layer and a top electrode improves the decrease in transparency and conductivity that has been observed to occur with increased thickness in other buffer structures. Therefore, high quality organic EL devices can be effectively provided by a sputtering method.

All publications and patent documents cited in this application are incorporated by reference in their entirety for all purposes to the same extent as if each individual publication or patent document were so individually denoted. By their citation of various references in this document Applicants do not admit that any particular reference is "prior art" to their invention.

What is claimed is:
1. An organic EL device comprising:
a substrate;
a bottom electrode formed on the substrate;
an organic EL layer formed on the bottom electrode, said organic EL layer comprising at least an organic light emissive layer;
a multilayer buffer structure formed on the organic EL layer and comprising two or more first type buffer layers containing a transparent material and two or more second type buffer layers containing a metal or an alloy, wherein each of the second type buffer layers are laminated on one of the first type buffer layers; and
a transparent top electrode through which light is emitted.
2. The organic EL device according to claim 1, wherein the buffer structure has a thickness less than or equal to 20 nm.
3. The organic EL device according to claim 1, wherein a ratio of a thickness of the first type buffer layer to a thickness of the second type buffer layer is in the range of 1:5 to 5:1.

TABLE 4

Performance evaluation of organic EL devices.

| | buffer structure | cathode material | current density (A/cm$^2$) | luminance (cd/m$^2$) | voltage (V) |
|---|---|---|---|---|---|
| Example 4 | (LiF 1.0 nm/MgAg 1.0 nm) × 5 | IZO | $1 \times 10^{-2}$ | 856 | 6.45 |
| Comp Ex 8 | LiF 5.0 nm/MgAg 5.0 nm | IZO | $1 \times 10^{-2}$ | 527 | 11.20 |
| Example 5 | (LiF 1.0 nm/AlLi 1.0 nm) × 5 | IZO | $1 \times 10^{-2}$ | 666 | 6.03 |
| Comp Ex 9 | LiF 5.0 nm/AlLi 5.0 nm | IZO | $1 \times 10^{-2}$ | 410 | 9.80 |
| Example 6 | (LiF 1.0 nm/AlDy 1.0 nm) × 5 | IZO | $1 \times 10^{-2}$ | 647 | 6.25 |
| Comp Ex 10 | LiF 5.0 nm/AlDy 5.0 nm | IZO | $1 \times 10^{-2}$ | 398 | 10.20 |
| Example 7 | (LiF 1.0 nm/ MgAgZn 1.0 nm) × 5 | IZO | $1 \times 10^{-2}$ | 875 | 6.58 |
| Comp Ex 11 | LiF 5.0 nm/MgAgZn 5.0 nm | IZO | $1 \times 10^{-2}$ | 538 | 11.80 |

As shown in Table 4, the organic EL devices having a multilayered buffer structure according to the present invention (Examples 4 through 7) exhibit superior performance as compared to organic EL devices having a buffer structure that does not have a multilayer structure (Comparative Examples 8 through 11). The multilayer buffer structure according to the invention has increased its thickness while preserving sufficient transmissivity and conductivity. Moreover, the buffer layer of the invention has effectively mitigated damage that would be inflicted on the organic EL layer by sputtering using an oxide target. Therefore, superior performance has been brought about to the organic EL devices of the invention.

It therefore has been discovered in accordance with the present invention that a multilayer buffer structure comprising alternately laminated layers of transparent material and layers of a metal or an alloy that is formed between an 4. The organic EL device according to claim 2, wherein a ratio of a thickness of the first type buffer layer to a thickness of the second type buffer layer is in the range of 1:5 to 5:1.
5. The organic EL device according to claim 1, wherein the second type buffer layer has a work function less than 4.8 eV.
6. The organic EL device according to claim 1, wherein the transparent material is selected from a group consisting of LiF, MgF$_2$, and Sb$_2$O$_3$.
7. The organic EL device according to claim 1, wherein the metal is selected from the group consisting of alkali metals, alkaline earth metals, rare earth elements, transition elements, and 3B group elements of the Periodic Table, and the alloy contains a metal selected from the group consisting of alkali metals, alkaline earth metals, rare earth elements, transition elements, and 3B group elements.

8. The organic EL device according to claim 1, wherein the metal and the alloy have electronegativity in the range of 0.2 to 2.0.

9. The organic EL device according to claim 1, wherein the metal is selected from Al, Ag, Mg, and Mn and the alloy contains one or more metals selected from Al, Ag, Mg, and Mn.

10. The organic EL device according to claim 1, wherein the multilayer buffer structure comprises five or more first type buffer layers containing a transparent material and five or more second type buffer layers containing a metal or an alloy.

11. A method for manufacturing an organic EL device comprising steps of:
 (a) forming a bottom electrode on a substrate;
 (b) forming an organic EL layer including at least an organic light emissive layer on the bottom electrode;
 (c) forming a buffer structure consisting of two or more first type buffer layers containing a transparent material and two or more second type buffer layers containing a metal or an alloy on the organic EL layer by alternately laminating the first type buffer layer and the second type buffer layer, and
 (d) forming a transparent top electrode through which light is emitted, on the buffer structure by means of a sputtering method.

12. The method according to claim 11, wherein the buffer structure has a thickness less than or equal to 20 nm.

13. The method according to claim 11, wherein a ratio of a thickness of the first type buffer layer to a thickness of the second type buffer layer is in the range of 1:5 to 5:1.

14. The method according to claim 12, wherein a ratio of a thickness of the first type buffer layer to a thickness of the second type buffer layer is in the range of 1:5 to 5:1.

15. The method according to claim 11, wherein the second type buffer layer has a work function less than 4.8 eV.

16. The method according to claim 11, wherein the transparent material is selected from a group consisting of $LiF$, $MgF_2$, and $Sb_2O_3$.

17. The method according to claim 11, wherein the metal is selected from the group consisting of alkali metals, alkaline earth metals, rare earth elements, transition elements, and 3B group elements of the Period Table, and the alloy contains a metal selected from the group consisting of alkali metals, alkaline earth metals, rare earth elements, transition elements, and 3B group elements.

18. The method according to claim 11, wherein the metal and the alloy have electronegativity in the range of 0.2 to 2.0.

19. The method according to claim 11, wherein the metal is selected from the group consisting of Al, Ag, Mg, and Mn and the alloy contains one or more metals selected from Al, Ag, Mg, and Mn.

20. The method according to claim 11, wherein each of the first type buffer layers and the second type buffer layers constructing the buffer structure is a discontinuous film comprising a plurality of island-shaped areas.

21. The method according to claim 11, wherein the thickness per layer is in the range of 1 to 5 nm.

22. The method according to claim 11, wherein the thickness per layer is in the range of 1 to 2 nm.

23. The organic EL device according to claim 1, wherein each of the first type buffer layers and the second type buffer layers constructing the buffer structure is a discontinuous film comprising a plurality of island-shaped areas.

24. The organic EL device according to claim 1, wherein the thickness per layer is in the range of 1 to 5 nm.

25. The organic EL device according to claim 1, wherein the thickness per layer is in the range of 1 to 2 nm.

26. The organic EL device according to claim 1, wherein the top electrode is ITO or IZO.

27. The organic EL device according to claim 10, wherein the top electrode is ITO or IZO.

28. The method according to claim 11, wherein the top electrode is ITO or IZO.

29. The method according to claim 11, wherein the buffer structure comprises five first type buffer layers and five second type buffer layers that are alternately laminated.

30. The method according to claim 29, wherein the top electrode is ITO or IZO.

* * * * *